US011333246B2

(12) United States Patent
Nguyen et al.

(10) Patent No.: US 11,333,246 B2
(45) Date of Patent: May 17, 2022

(54) CHAMBER BODY DESIGN ARCHITECTURE FOR NEXT GENERATION ADVANCED PLASMA TECHNOLOGY

(71) Applicant: Applied Materials, Inc., Santa Clara, CA (US)

(72) Inventors: Andrew Nguyen, San Jose, CA (US); Bradley J. Howard, Pleasanton, CA (US); Nicolas J. Bright, Saratoga, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 654 days.

(21) Appl. No.: 14/693,254

(22) Filed: Apr. 22, 2015

(65) Prior Publication Data

US 2016/0215883 A1   Jul. 28, 2016

Related U.S. Application Data

(60) Provisional application No. 62/108,052, filed on Jan. 26, 2015.

(51) Int. Cl.
*F16J 10/02* (2006.01)
*H01J 37/32* (2006.01)

(52) U.S. Cl.
CPC ......... *F16J 10/02* (2013.01); *H01J 37/32834* (2013.01); *H01J 37/32899* (2013.01)

(58) Field of Classification Search
None
See application file for complete search history.

(56) References Cited

U.S. PATENT DOCUMENTS

| 8,679,987 | B2* | 3/2014 | Reilly | C23C 16/26 257/E21.024 |
| 2002/0157611 | A1* | 10/2002 | Bondestam | C23C 16/301 118/725 |
| 2003/0176074 | A1* | 9/2003 | Paterson | H01J 37/32082 438/710 |

(Continued)

FOREIGN PATENT DOCUMENTS

| CN | 101779269 A | 7/2010 |
| CN | 103035469 A | 4/2013 |

(Continued)

OTHER PUBLICATIONS

International Search Report and Written Opinion for Application No. PCT/US2016/013440 dated Apr. 25, 2016; 10 Total Pages.

(Continued)

*Primary Examiner* — Parviz Hassanzadeh
*Assistant Examiner* — Tiffany Z Nuckols
(74) *Attorney, Agent, or Firm* — Patterson + Sheridan LLP; B. Todd Patterson

(57) ABSTRACT

An apparatus for processing a substrate is disclosed and includes, in one embodiment, a twin chamber housing having two openings formed therethrough, a first pump interface member coaxially aligned with one of the two openings formed in the twin chamber housing, and a second pump interface member coaxially aligned with another of the two openings formed in the twin chamber housing, wherein each of the pump interface members include three channels that are concentric with a centerline of the two openings.

16 Claims, 9 Drawing Sheets

(56) References Cited

U.S. PATENT DOCUMENTS

| | | | |
|---|---|---|---|
| 2005/0268852 A1* | 12/2005 | Hatanaka | C23C 16/0236 118/723 VE |
| 2008/0178797 A1* | 7/2008 | Fodor | C23C 16/46 118/75 |
| 2009/0028761 A1 | 1/2009 | Devine et al. | |
| 2010/0193132 A1* | 8/2010 | Wi | H01L 21/6719 156/345.51 |
| 2012/0111427 A1* | 5/2012 | Nozawa | H01J 37/32862 137/511 |
| 2012/0222813 A1* | 9/2012 | Pal | C23C 16/4412 156/345.31 |
| 2013/0087286 A1* | 4/2013 | Carducci | H05H 1/46 156/345.43 |
| 2013/0302996 A1* | 11/2013 | Reilly | C23C 16/26 438/758 |
| 2013/0323860 A1 | 12/2013 | Antolik et al. | |
| 2013/0340938 A1* | 12/2013 | Tappan | H01J 37/32091 156/345.29 |
| 2015/0211114 A1* | 7/2015 | Kangu | C23C 16/4408 118/722 |
| 2015/0293527 A1 | 10/2015 | Nguyen et al. | |

FOREIGN PATENT DOCUMENTS

| | | |
|---|---|---|
| CN | 104124128 A | 10/2014 |
| JP | 2011511474 A | 4/2011 |
| JP | 2011-529136 A | 12/2011 |
| JP | 2013-53016 A | 3/2013 |
| JP | 2013-084602 A | 5/2013 |
| WO | 2005108641 A2 | 11/2005 |
| WO | 2012138866 A1 | 10/2012 |

OTHER PUBLICATIONS

Chinese Office Action for Application No. 201680005763.2 dated Dec. 3, 2018.

Taiwan Office Action for Application No. 105101259 dated Feb. 15, 2019.

Japanese Office Action for Application No. JP 2017-539275 dated Feb. 18, 2020.

Chinese Office Action for Application No. CN 201680005763.2 dated Aug. 19, 2019.

Notice of Allowance for Application No. CN 201680005763.2 dated Apr. 2, 2020.

Korean Office Action issued to Application No. 10-2017-7023861 dated Feb. 24, 2022.

* cited by examiner

CHAMBER BODY DESIGN ARCHITECTURE FOR NEXT GENERATION ADVANCED PLASMA TECHNOLOGY

CROSS-REFERENCE TO RELATED APPLICATIONS:

This application claims benefit of U.S. Provisional Patent Application Ser. No. 62/108,052 filed Jan. 26, 2015, which is hereby incorporated by reference herein.

BACKGROUND

Field

Embodiments described herein generally relate to a modular two chamber design providing independent processing in each of the two chambers. More specifically, embodiments disclosed herein relate to etch plasma chamber technology and hardware design architecture that provides an independent variable gap process volume for multiple process regimes in a dual chamber architecture.

Description of the Related Art

As the technology nodes advance and reduced size device geometries requires etch plasma processing chambers with precise control of input parameters. Input parameters include electrical, radio frequency (RF), gas flow and thermal control. Symmetry in one or more of the input parameters is important to improve on-wafer uniformity and yield. The symmetry of the input parameters may be provided by improved chamber hardware.

Accordingly, there is a need in the art for an improved chamber and method of using the same.

SUMMARY

An apparatus for processing a substrate is disclosed and includes, in one embodiment, a twin chamber housing having two openings formed therethrough, a first pump interface member coaxially aligned with one of the two openings formed in the twin chamber housing, and a second pump interface member coaxially aligned with another of the two openings formed in the twin chamber housing, wherein each of the pump interface members include three channels that are concentric with a centerline of the two openings.

In another embodiment, an apparatus for processing a substrate is provided. The apparatus includes a twin chamber housing, a modular pumping interface having at least two separated interior volumes coupled to the twin chamber housing and providing two separate processing volumes within the twin chamber housing.

In another embodiment, a twin volume substrate processing chamber is provided. The twin volume substrate processing chamber includes a chamber body having a first opening and a second opening formed therethrough, a first pump interface member coaxially aligned with a centerline of the first opening, the first pump interface member having a plurality of first channels formed therein parallel to the centerline, and a second pump interface member coaxially aligned with a centerline of the second opening and fluidly separated from the first pump interface member, the second pump interface member having a plurality of second channels formed therein parallel to the centerline.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to chamber hardware and associated methods having a symmetric flow design to pump out processed by-products from inside the chamber and maintain vacuum to enable improved flow conductance. Embodiments described herein also provide a chamber having a shorter mean free path for gas flow travel before the gas is pumped-out in an axial direction. Axially symmetric chamber hardware as provided herein helps in reducing on wafer skews and improves flow conductance. Embodiments disclosed herein include a twin chamber body design including a process portion and a flow block portion. The flow block portion provides axially-symmetric flow and is capable of providing variable process volumes for multiple applications and process regimes. The flow block design may also enable a modular design solution and/or cost effective manufacturing.

Figure 1A:
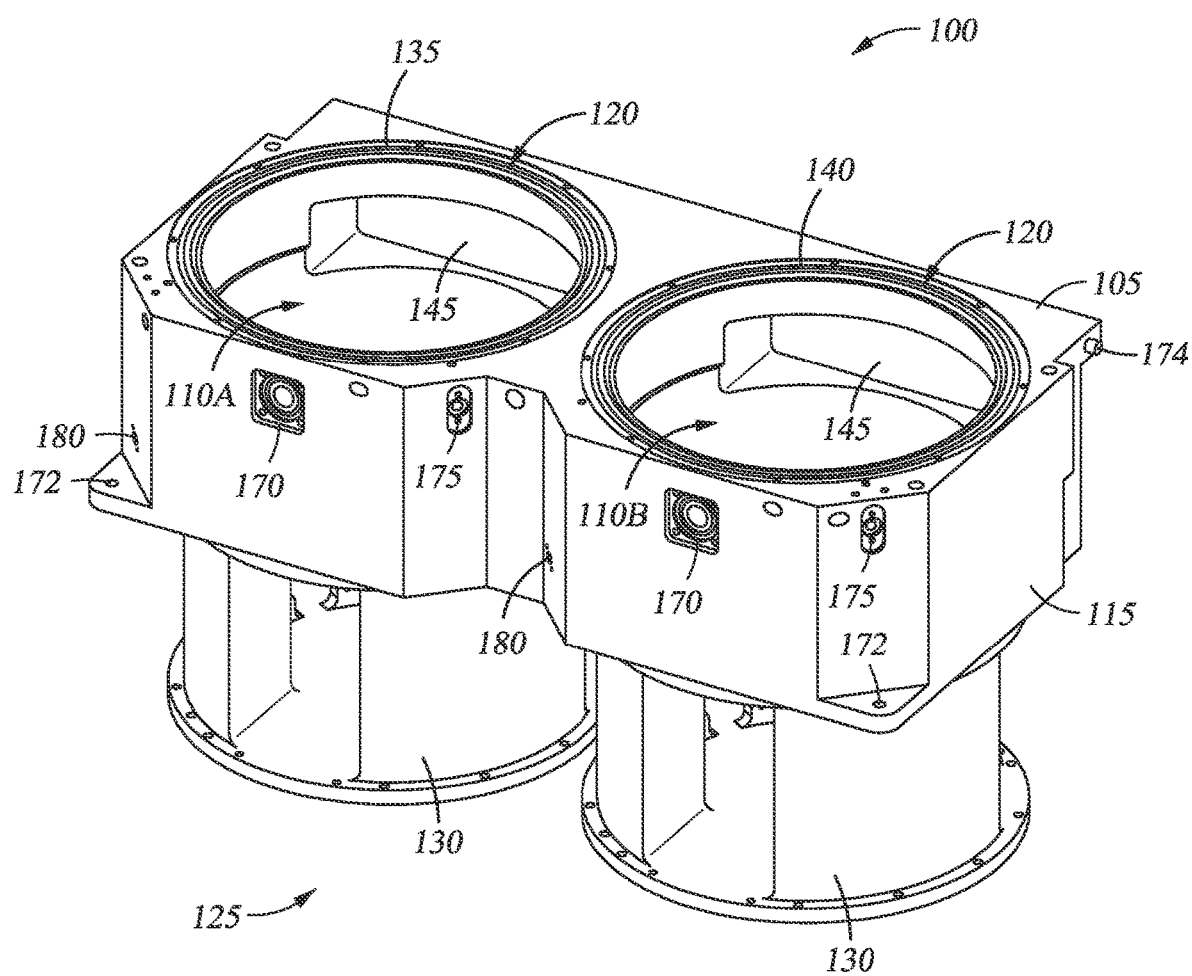
FIG. 1A illustrates an isometric view of a twin chamber housing.
Figure 1B:
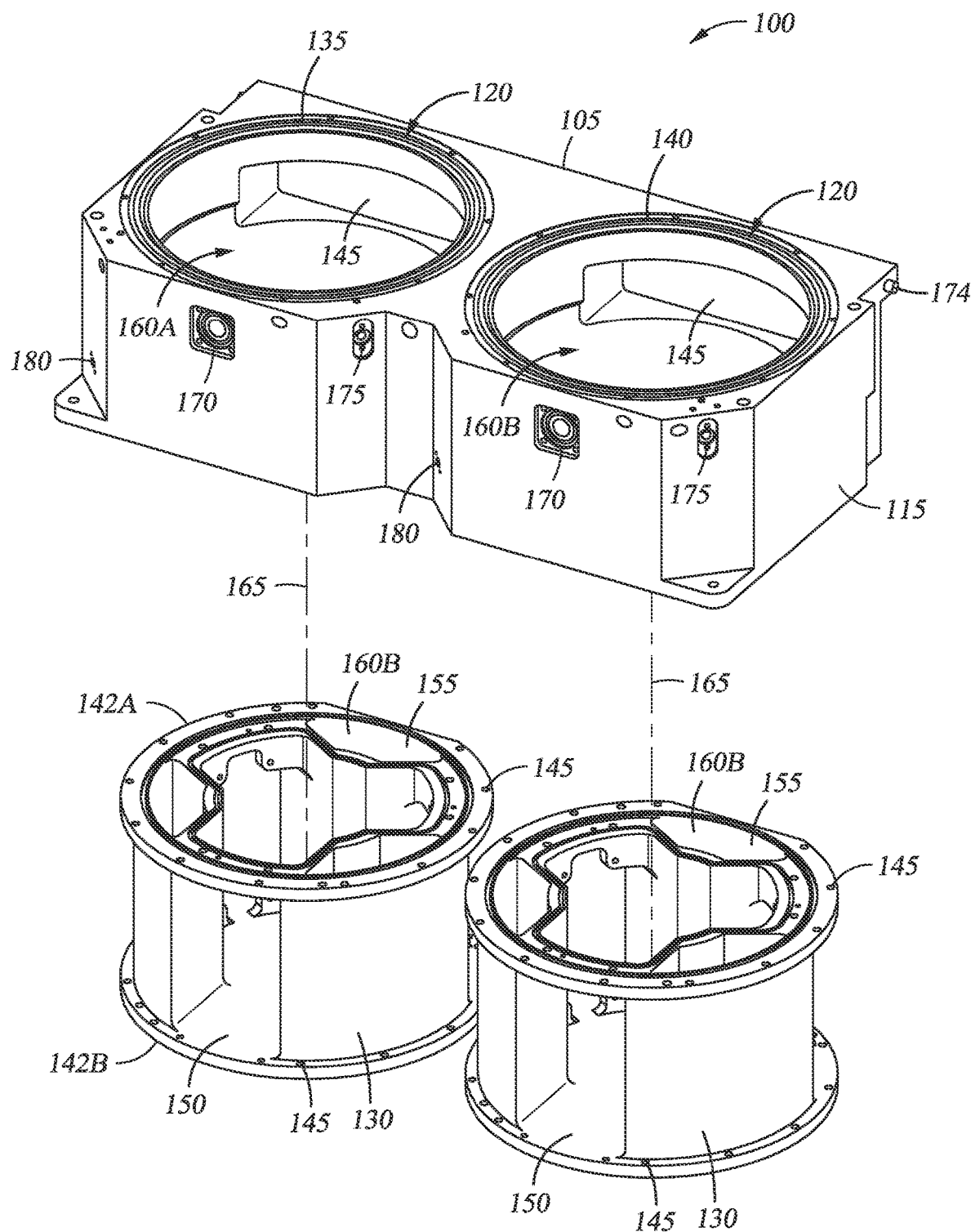
FIG. 1B shows an exploded view of the twin chamber housing shown in FIG. 1A.

FIG. 1A illustrates an isometric view of a twin chamber housing 100. FIG. 1B shows an exploded view of the twin chamber housing 100 shown in FIG. 1A. The twin chamber housing 100 includes a chamber body 105 having dual process volumes 110A and 110B. Each of the process volumes 110A and 110B may be bounded by a chamber sidewall 115 and a lid (not shown) that couples to a lid interface 120. The twin chamber housing 100 also includes a modular pumping interface 125 which includes two pump interface members 130 that form a boundary of the process volumes 110A and 110B. The twin chamber housing 100 may be installed or retrofitted on existing semiconductor substrate manufacturing platforms where the PRODUCER® processing system, commercially available from Applied Materials, Inc., of Santa Clara, Calif. is utilized. Examples of platforms where the twin chamber processing housing 100 may be used include the CENTURA® platform available from Applied Materials, Inc., of Santa Clara, Calif. Embodiments of the twin chamber processing housing 100 may also be utilized on other suitably adapted processing systems or platforms having processing chambers disposed about a central transfer chamber, including those from other manufacturers. The twin chamber housing 100 as described herein may be coupled to a platform or processing system without increasing the footprint of the platform or processing system.

The twin chamber housing 100 includes separate dual process volumes 110A and 110B where individual semiconductor substrates may be processed by deposition of materials on the substrates, removal of material on the substrates, heating of the substrates, or other processes performed on the substrates. Each of the process volumes 110A and 110B may be fitted with showerheads and substrate supports (both not shown) to enable processes such as etching, deposition or other thermal processes. The process volumes 110A and 110B are environmentally separated such that processing parameters may be controlled in each process volume 110A and 110B separately. The twin chamber housing 100 may be made of aluminum or other process compatible metal. Each of the process volumes 110A and 110B may be sized to process substrates having a 200 millimeter (mm) diameter, 300 mm diameter, or 450 mm diameter.

The lid interface 120 may include a sealing member 135, such as an o-ring, that facilitates sealing between a lid (not shown), that couples to the chamber body 105. In some embodiments, a lid may be hingedly coupled to the chamber body 105. In other embodiments, a lid may be coupled to the chamber body 105 utilizing fasteners coupled to threaded holes 140 formed in the chamber body 105. Openings 145 are also formed in the chamber body 105 for transfer of substrates into and out of the process volumes 110A and 110B.

As shown in FIG. 1B, each of the pump interface members 130 may include flanges 142A and 142B on opposing ends thereof. A first flange 142A (upper flange) may include openings 145 formed therein to facilitate coupling of the individual pump interface members 130 to the chamber body 105. A second flange 142B (lower flange) may include openings 145 formed therein to facilitate coupling of the individual pump interface members 130 to a vacuum pump (not shown). The pump interface members 130 include slots 150 formed therein and the slots 150 are surrounded by individual pumping channels 155. In the embodiment shown, each of the pump interface members 130 have three slots 150 and three pumping channels 155. The slots 150 and/or the pumping channels 155 may be equally spaced relative to each other.

The twin chamber housing 100 includes a pair of first openings 160A formed in the chamber body 105 and a set of second openings 160B (corresponding to the pumping channels 155 of the pump interface members 130) that form the process volumes 110A and 110B (shown in FIG. 1A). The volumes of each of the pumping channels 155 may be substantially equal in some embodiments. "Substantially equal" as relating to the pumping channels 155 includes a volume metric that is identical or within about 1% to about 5% of each other. A centerline 165 of the twin chamber housing 100 is shared by each of the first openings 160A and each of the pump interface members 130. The pumping channels 155 are concentric or coaxial to the centerline 165. Thus, the process volumes 110A and 110B, formed by the first openings 160A and the plurality of second openings 160B are axially symmetric, which enables enhanced pumping and/or conduction in each of the process volumes 110A and 110B.

Referring again to FIG. 1A, the chamber body 105 includes openings 172 for coupling to a platform, such as the CENTURA® platform as described above. The chamber body 105 may also include a hinge feature 174 for coupling to a lid (not shown). The chamber body 105 may also include a view port 170 as well as a port 175 for a sensor, such as an endpoint detection device, for each of the process volumes 110A and 110B. A port 180 may also be included for a pressure sensing device for each of the process volumes 110A and 110B.

Figure 2A:
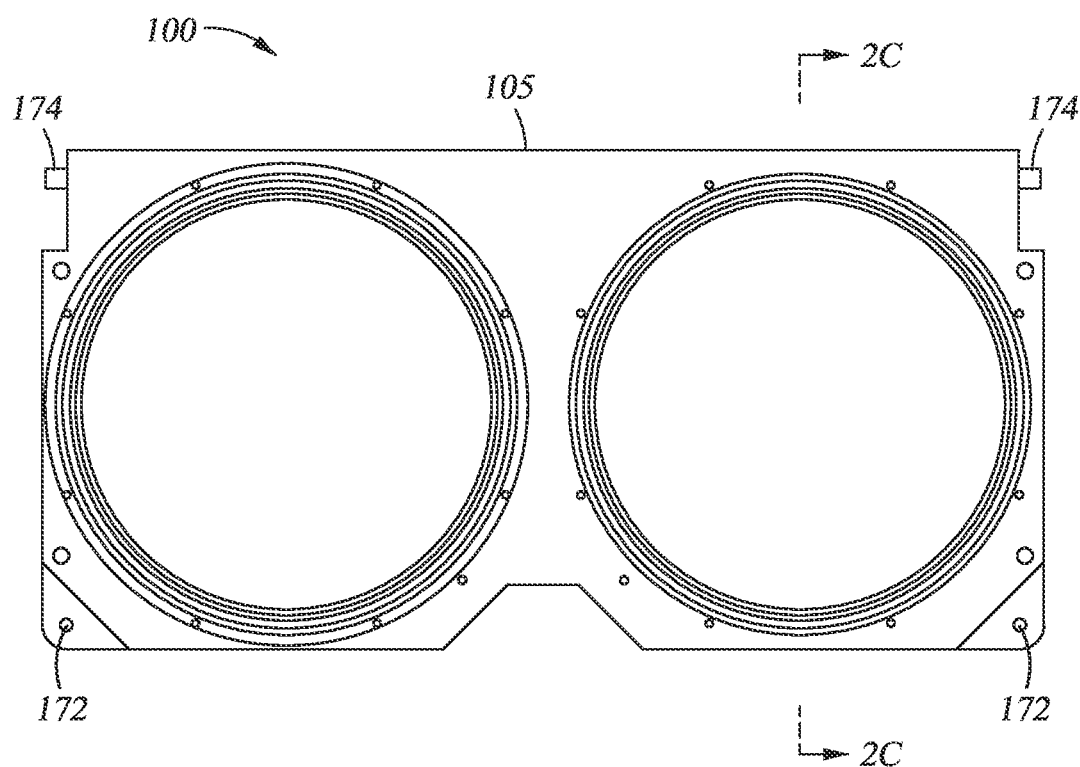
FIG. 2A is a top plan view of a chamber body.
Figure 2B:
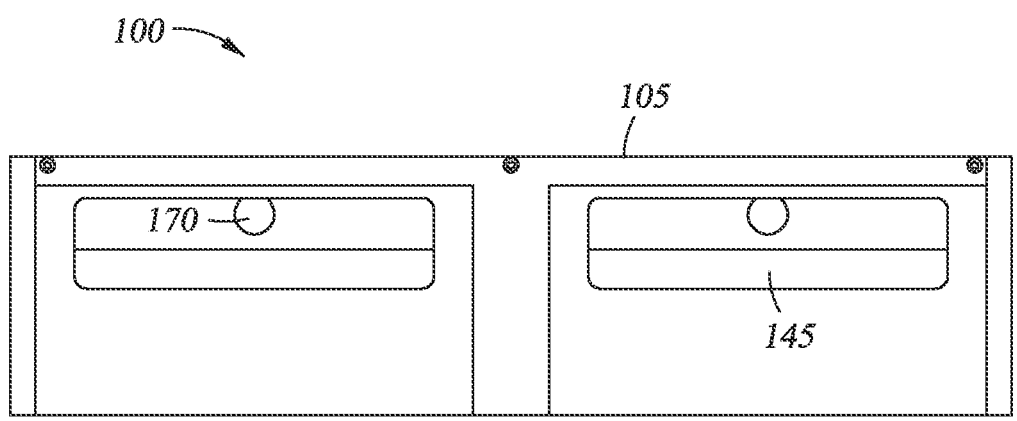
FIG. 2B is a side view of the chamber body of FIG. 2A.
Figure 2C:
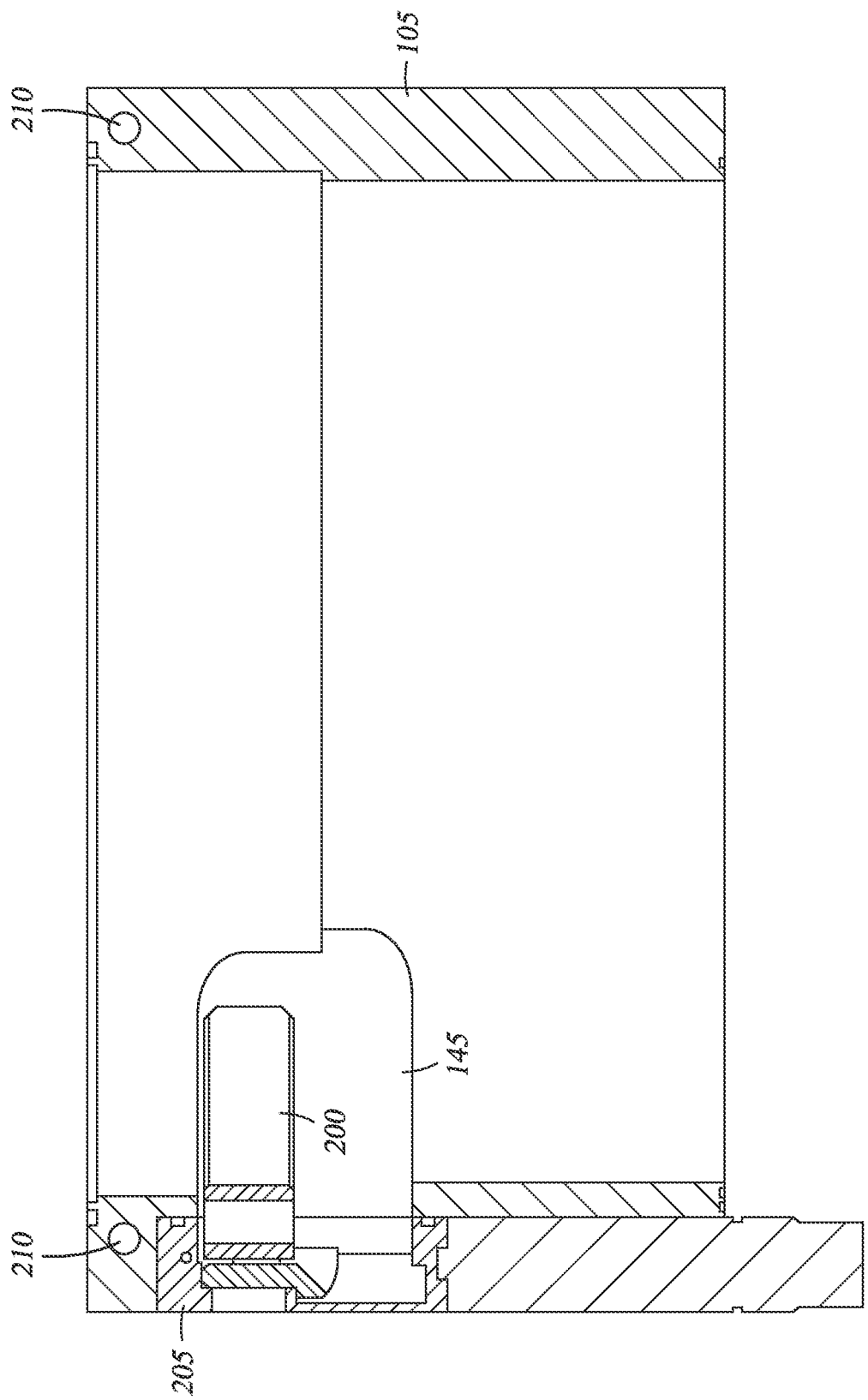
FIG. 2C is a side cross-sectional view of the chamber body along lines 2C-2C of FIG. 2A.

FIGS. 2A, 2B and 2C are various views of the chamber body 105 of the twin chamber housing 100. FIG. 2A is a top plan view of the chamber body 105. FIG. 2B is a side view of the chamber body 105. FIG. 2C is a side cross-sectional view of the chamber body 105 along lines 2C-2C of FIG. 2A.

As shown in FIG. 2C, the chamber body 105 includes a door 200 that is movable within the opening 145. The door 200 may interface with a transfer chamber (not show) on a platform, such as the CENTURA® platform as described above. The opening 145 may also include a liner assembly 205. A fluid channel 210 may also be formed in the chamber body 105 for cooling the chamber body 105.

Figure 3A:
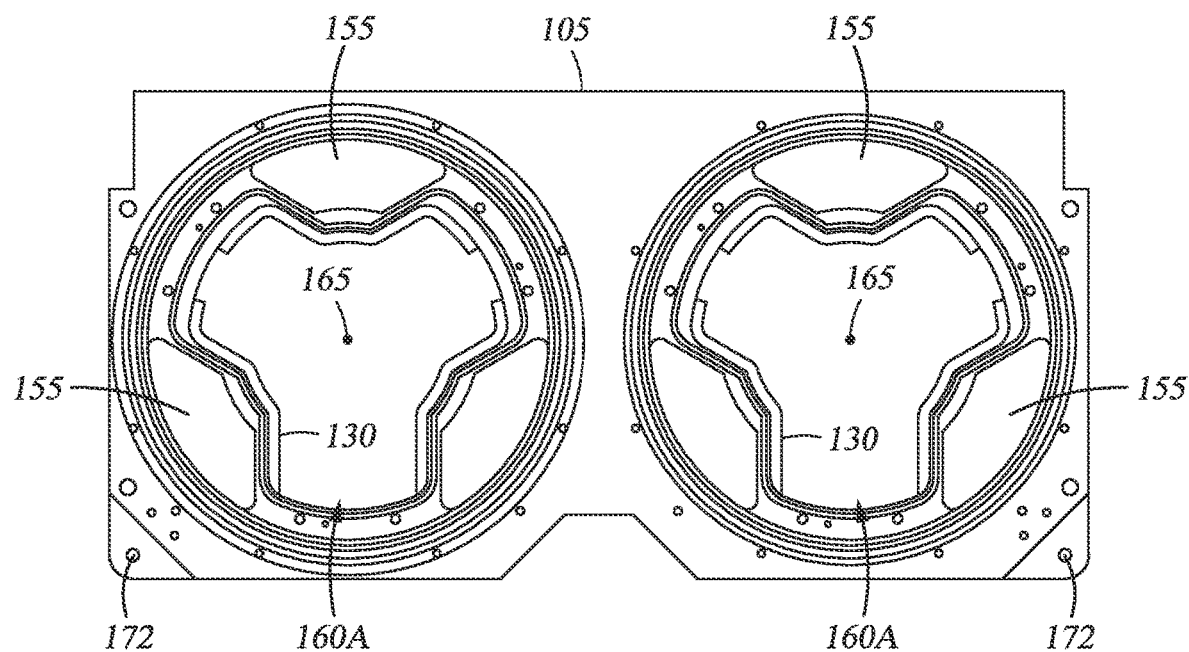
FIG. 3A is a top plan view of the twin chamber housing having the pump interface members axially aligned with the openings of the chamber body.

FIG. 3A is a top plan view of the twin chamber housing 100 having the pump interface members 130 axially aligned with the openings 160A of the chamber body 105. Each of the pumping channels 155 (the second openings 160B) of the pump interface members 130 are concentric with the centerline 165.

Figure 3B:
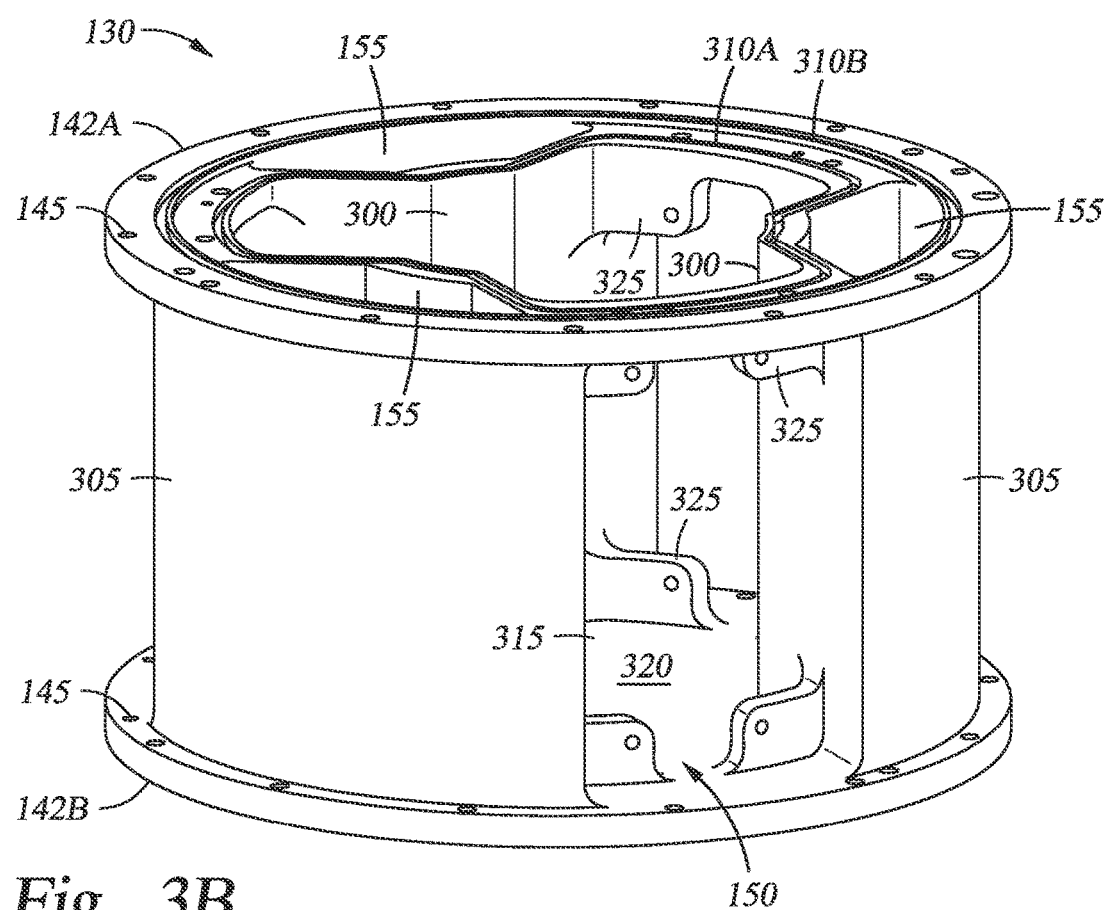
FIG. 3B is an isometric view of one embodiment of a pump interface member.

FIG. 3B is an isometric view of one embodiment of a pump interface member 130. The pump interface member 130 includes a plurality of pumping channels 155 adjacent to a slot 150. The slots 150 may be utilized to install and/or service devices that may be used in the process volumes 110A and 110B (shown in FIG. 1A), such as a substrate support or pedestal. The slots 150 are open to atmospheric pressures and temperatures and may be used to provide control connections (electrical, hydraulic, pneumatic lines, etc.) to the substrate support or pedestal.

Each of the pumping channels 155 are enclosed by an inner sidewall 300 and an outer sidewall 305. A first sealing interface 310A, such as an o-ring, or an o-ring channel or groove, may be included to surround an atmospheric region 315 defined by the inner sidewall 300 and a bottom 320 of the pump interface member 130. A second sealing interface 310B, such as an o-ring, or an o-ring channel or groove, may be included to surround a perimeter of each of the pumping channels 155. A plurality of coupling members 325 may be at least partially disposed in the slots 150. The coupling members 325 may be used to fasten peripheral components, such as a substrate support or pedestal, or control connections (electrical, hydraulic, pneumatic lines, etc.) to the substrate support or pedestal, to the pump interface member 130.

Figure 4A:
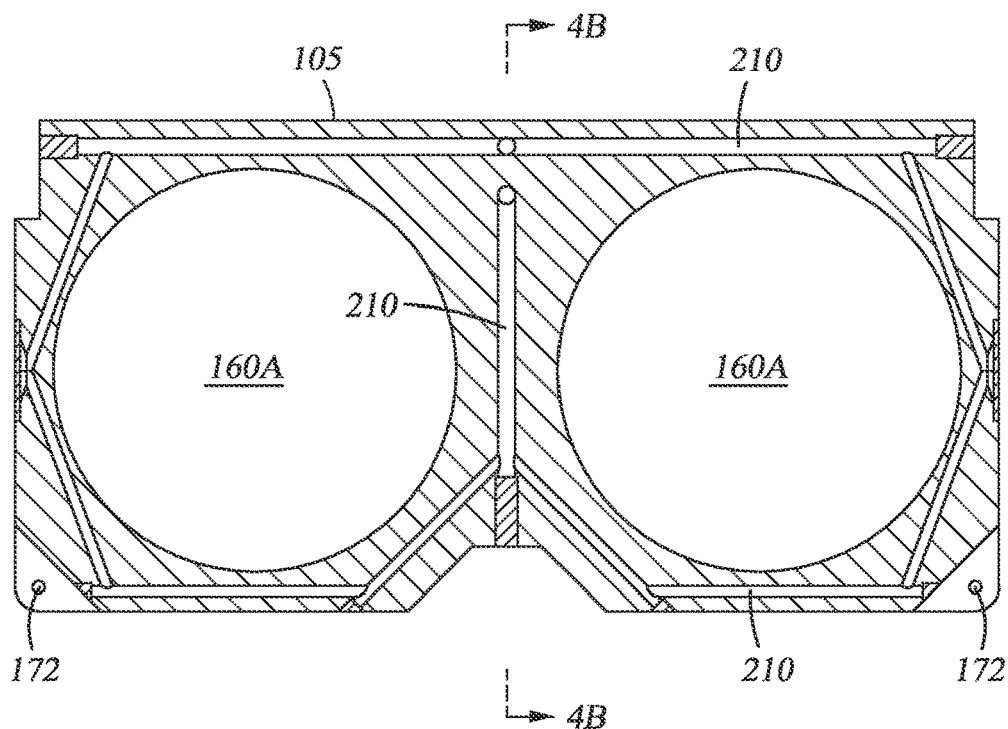
FIG. 4A is a cross-sectional plan view of the chamber body.
Figure 4B:
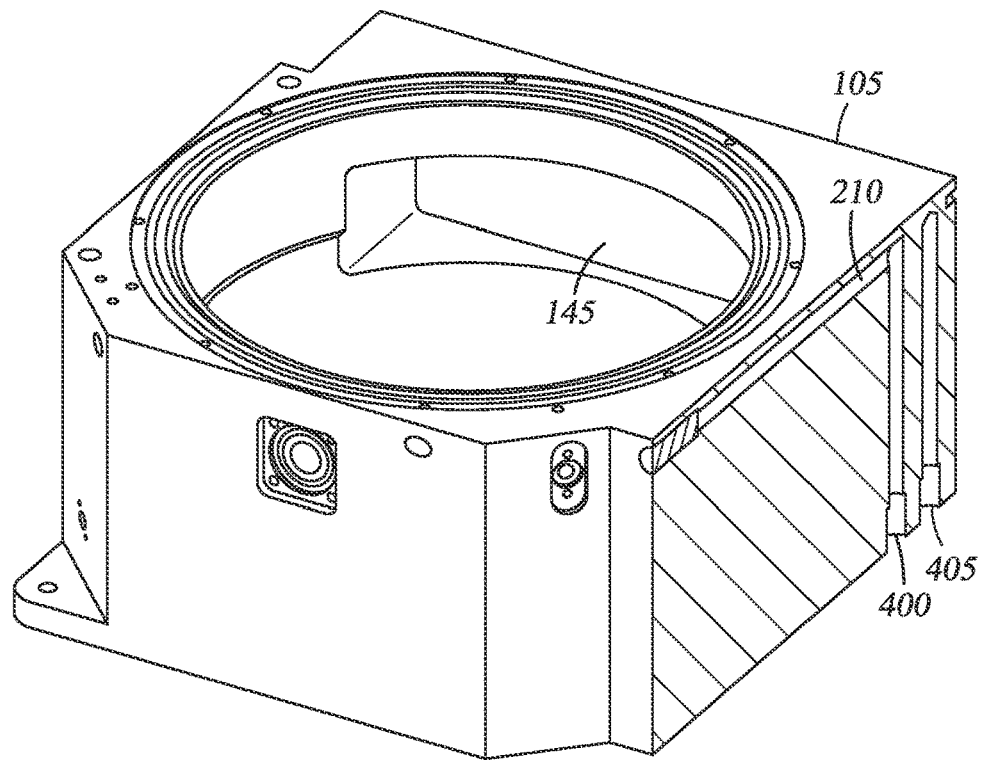
FIG. 4B is an isometric cross-sectional view of the chamber body along lines 4B-4B of FIG. 4A.

FIG. 4A is a cross-sectional plan view of the chamber body 105 and FIG. 4B is an isometric cross-sectional view of the chamber body 105 along lines 4B-4B of FIG. 4A.

A fluid channel 210 is shown in the chamber body 105 that at least partially surrounds each of the first openings 160A. The fluid channel 210 may be formed by gun drilling. As shown in FIG. 4B. the fluid channel 210 may be coupled to a fluid source via an inlet 400 and an outlet 405.

Figure 5:
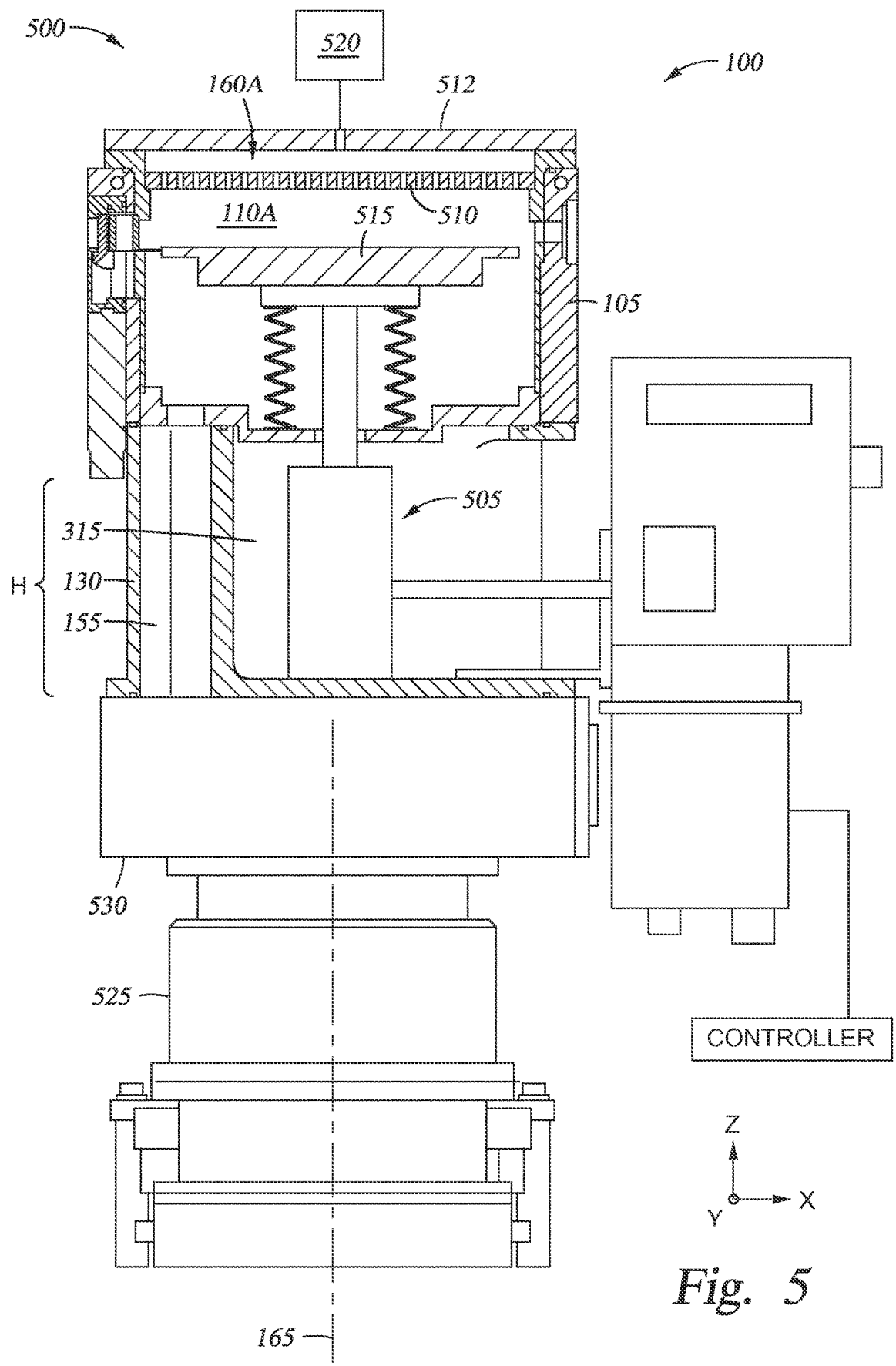
FIG. 5 is a schematic cross-sectional view of a process chamber system according to one embodiment.

FIG. 5 is a schematic cross-sectional view of a process chamber system 500 according to one embodiment. The process chamber system 500 includes the twin chamber housing 100 according to embodiments described herein. However, only one side of the twin chamber housing 100 is shown in this cross-section. The process chamber system 500 may be configured to perform an etch process, but may also be utilized to perform a chemical vapor deposition process, an epitaxial deposition process, a through via silicon process, or other thermal process utilized in the manufacture of electronic devices on a substrate.

The process chamber system 500 includes the process volume 110A consisting of the first opening 160A and a plurality of pumping channels 155 of the pump interface member 130. A substrate support or pedestal 505 is shown positioned at least partially in the atmospheric region 315 of the pump interface member 130 and the first opening 160A. A gas distribution plate or showerhead 510 may be disposed in the first opening 160A. The showerhead 510 may function as an anode electrode and a substrate supporting surface 515 of the pedestal 505 may function as a cathode in some embodiments. Gases may be provided to the process volume 110A from a gas source 520 and distributed through the process volume 110A by the showerhead 510. A lid 512 may be coupled to the chamber body 105 to enclose the process volume 110A. A vacuum pump 525 may be coupled to the pump interface member 130 and, in some embodiments, a symmetric valve body 530 is disposed between the vacuum pump 525 and the pump interface member 130. The vacuum pump 525 may be a turbo-molecular pump and the valve body 530 may be a spherical flow valve.

In some embodiments, the pedestal 505 is coupled to a lift motor that moves the substrate supporting surface 515 of the pedestal 505 vertically (Z direction) relative to the showerhead 510. The vertical movement of the supporting surface 515 may be used to adjust a gap between a substrate (not shown) disposed on the substrate supporting surface 515 of the pedestal 505 and the showerhead 510. A height H of the pump interface member 130 may be chosen based on the vertical stroke of the pedestal 505. If a pedestal having a shorter or longer stroke length (or no stroke length at all), the height H may be changed in order to enlarge or minimize volumes in the pumping channels 155.

Figure 6:
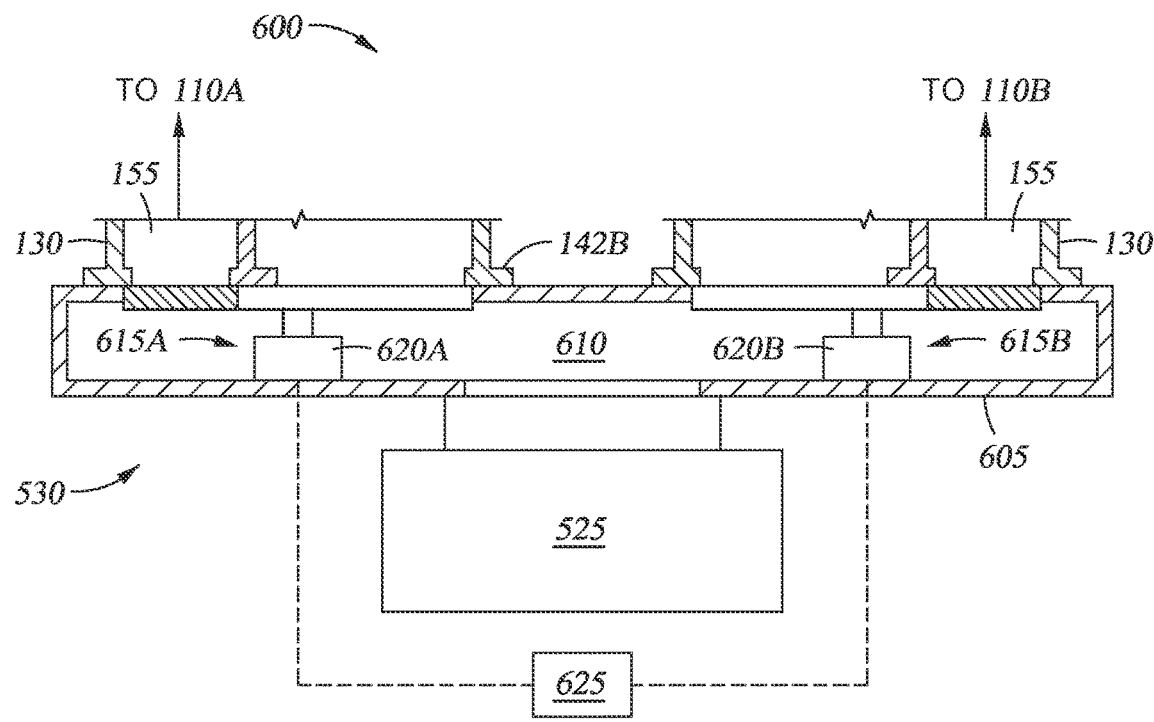
FIG. 6 is a schematic side cross-sectional view of a portion of two pump interface members coupled to one embodiment of a pump interface.

FIG. 6 is a schematic side cross-sectional view of a portion of two pump interface members 130 coupled to one embodiment of a pump interface 600. The pump interface 600 includes an adapter housing 605 coupled to the pump interface members 130 and a single vacuum pump 525. The adapter housing 605 includes an interior volume 610 that is in selective fluid communication with the process volumes 110A and 110B (shown in FIG. 1A) via the pumping channels 155. The adapter housing 605 includes a first valve 615A that is operable to control fluid communication between the process volume 110A and the interior volume 610. The adapter housing 605 also includes a second valve 615B that is operable to control fluid communication between the process volume 110B and the interior volume 610. Each of the first valve 615A and second valve 615B may be selectively open and closed by a dedicated actuator 620A and 620B, respectively. Each actuator 620A, 620B may be coupled to a controller 625 that independently controls opening and closing of the valves 615A and 615B. In one embodiment, when the valves 615A and 615B are in an open state, one or both of the process volumes 110A and 110B are in fluid communication with the interior volume 610. In another embodiment, when one of the valves 615A or 615B is closed, only the respective process volume (110A or 110B) is in fluid communication with the interior volume 610. In some embodiments, the valves 615A and 615B may be partially open to function as a throttle valve with each of the process volumes 110A and 110B.

Figure 7:
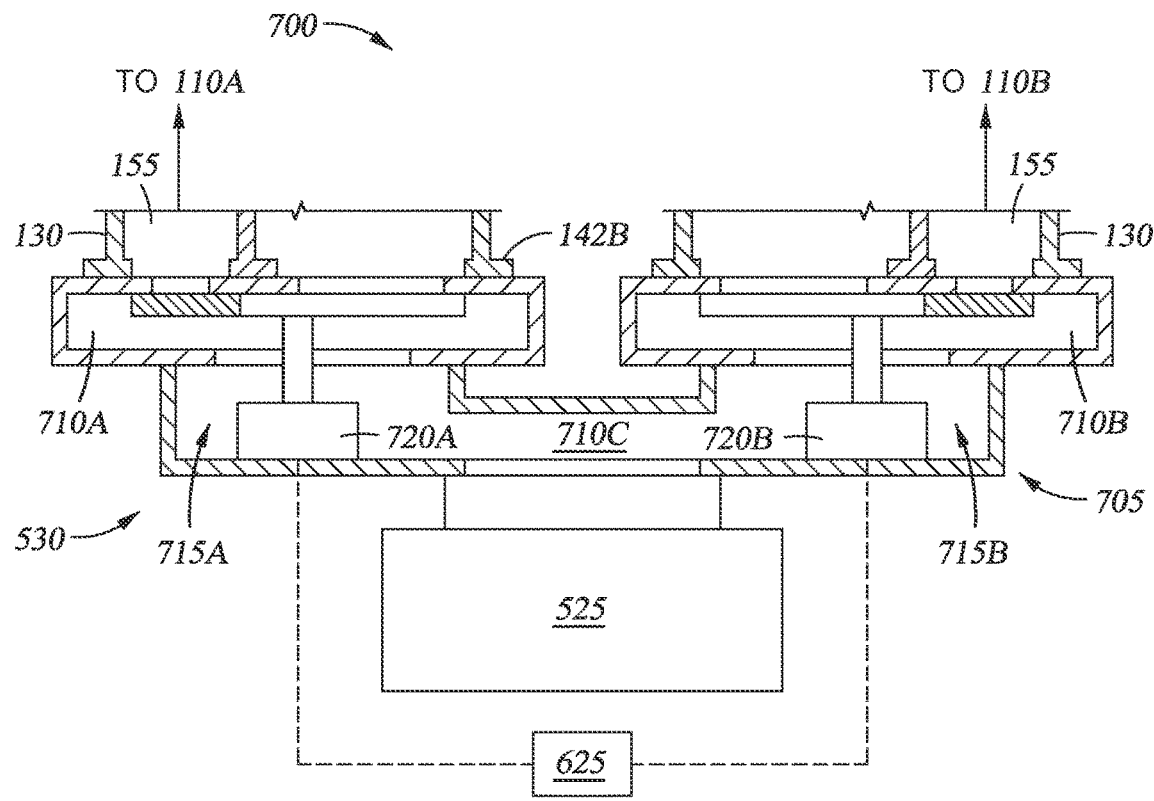
FIG. 7 is a schematic side cross-sectional view of a portion of two pump interface members coupled to another embodiment of a pump interface.

FIG. 7 is a schematic side cross-sectional view of a portion of two pump interface members 130 coupled to another embodiment of a pump interface 700. The pump interface 700 includes an adapter housing 705 coupled to the pump interface members 130 and a single vacuum pump 525. The adapter housing 705 includes a first interior volume 710A that is in selective fluid communication with the process volume 110A (shown in FIG. 1A) and a central or third interior volume 710C. The adapter housing 705 includes a second interior volume 710B that is in selective fluid communication with the process volume 110B (shown in FIG. 1A) and the third interior volume 710C. The adapter housing 705 includes a first valve 715A that is operable to control fluid communication between the process volume 110A and the third interior volume 710C. The adapter housing 705 also includes a second valve 715B that is operable to control fluid communication between the process volume 110B and the third interior volume 710C. Each of the first valve 715A and second valve 715B may be selectively open and closed by a dedicated actuator 720A and 720B, respectively. Each actuator 720A, 720B may be coupled to a controller 625 that independently controls opening and closing of the valves 715A and 715B. In one embodiment, when the valves 715A and 715B are in an open state, one or both of the process volumes 110A and 110B are in fluid communication with the third interior volume 710C. In another embodiment, when one of the valves 715A or 715B is closed, only the respective process volume (110A or 110B) is in fluid communication with the third interior volume 710C. In some embodiments, the valves 715A and 715B may be partially open to function as a throttle valve with each of the process volumes 110A and 110B.

Figure 8:
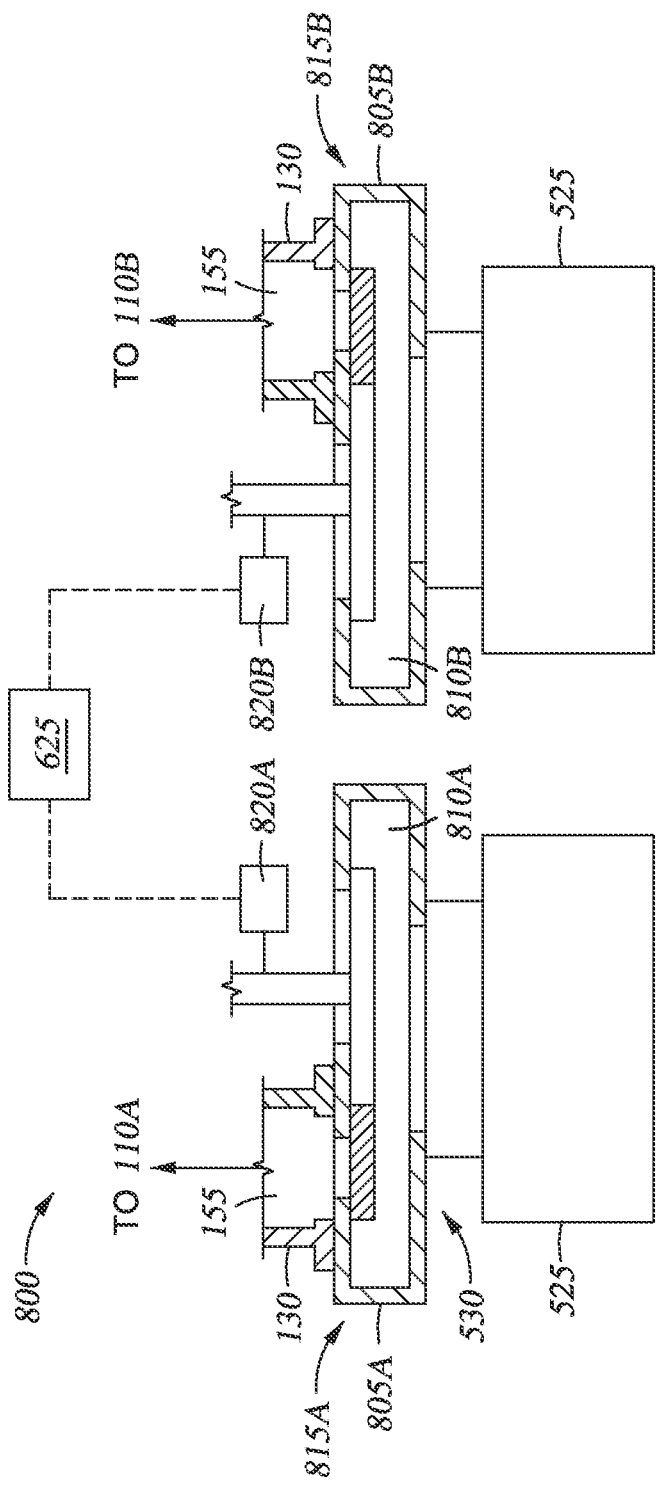
FIG. 8 is a schematic side cross-sectional view of a portion of two pump interface members coupled to another embodiment of a pump interface.

FIG. 8 is a schematic side cross-sectional view of a portion of two pump interface members 130 coupled to another embodiment of a pump interface 800. The pump interface 800 includes two adapter housings 805A and 805B having a respective interior volume 810A, 810B. Each adapter housing 805A and 805B is coupled to a dedicated vacuum pump 525. The interior volume 810A is in selective fluid communication with the process volume 110A (shown in FIG. 1A), and the interior volume 810B is in selective fluid communication with the process volume 110B (shown in FIG. 1A). The adapter housing 805A includes a first valve 815A that is operable to be in selective fluid communication with the process volume 110A via the pumping channels 155. Likewise, the adapter housing 805B includes a second valve 815B that is operable to be in selective fluid communication with the process volume 110B via the pumping channels 155. Each of the first valve 815A and the second valve 815B are selectively open and closed by a dedicated actuator 820A and 820B, respectively. Each actuator 820A, 820B may be coupled to a controller 625 that independently controls opening and closing of the valves 815A and 815B.

Embodiments of the pump interfaces 600, 700 and 800 shown and described in FIGS. 6-8 provide for independent vacuum application to each of the process volumes 110A and 110B of the twin chamber housing 100 of FIG. 1A. The adapter housings 605, 705, and 805A and 805B, may be utilized to provide independent flow regimes by actuation of respective valves. Thus, differential or similar pressures may be provided in each of the process volumes 110A and 110B. In some embodiments, one process volume (i.e., 110A or 110B) may be closed so that the other process volume may be used, which provides utilization of one chamber of the twin chamber housing 100, if desired.

Embodiments of the twin chamber housing 100 as described herein include axially-symmetric positioning of process chamber hardware which may improve process flow uniformity/conductance inside the process volumes 110A and 110B. The modularity of the twin chamber housing 100 provides easy removal and attachment of pump interface members 130 of varying sizes (i.e., volumes and/or heights). For example, the pump interface members 130 may include a variable volume in the pumping channels 155 based on the manufactured height H (FIG. 5) of the pump interface member 130. The height H may be based on the stroke length of the pedestal 505. Further, the pump interface members 130 of the twin chamber housing 100 provides three slots 150 and an atmospheric region 315 to accommodate components of a substrate support, RF/DC feeds, water lines, helium feed lines (for back side cooling), and the like. Mounting the symmetric pump interfaces 600, 700 or 800 and vacuum pump(s) 525 to the pump interface members 130 provides symmetric flow and conductance in each of the process volumes 110A and 110B of the twin chamber housing 100. Further, footprint of the tool is substantially unchanged.

The twin chamber housing 100 as described herein also minimizes or eliminates gas conduction problems as well as providing good process control and on-wafer uniformity. The fundamental axial symmetry of the twin chamber housing 100 reduces on wafer skews and improves flow conductance inside the chamber. Further, the solution provided by the twin chamber housing 100 is simple, scalable, retrofittable and process transparent. Manufacturing cost is minimized by simplifying the chamber body into two separate parts (one being the chamber body 105 and the other being the pump interface members 130), which reduces one or more of handling issues, finishing issues, tooling issues, and/or footprint issues. The variable chamber volume facilitated by the pump interface members 130 provides improved uniformity and control for the 16 nanometer (nm) node as well as future sustaining/applications expansion (less than 10 nm node).

While the foregoing is directed to embodiments of the present disclosure, other and further embodiments of the disclosure may be devised without departing from the basic scope thereof, and the scope thereof is determined by the claims that follow.

What is claimed is:

1. An apparatus for processing a substrate, comprising:
a twin chamber housing comprising a body having two transfer openings and two cylindrical openings formed through the body, wherein each of the two transfer openings corresponds to each of the two cylindrical openings;
a first pump interface member coaxially aligned with one of the two cylindrical openings formed in the twin chamber housing;
a second pump interface member coaxially aligned with another of the two cylindrical openings formed in the twin chamber housing, wherein each of the pump interface members include a first flange at a first end and a second flange at a second end opposing the first end, wherein each of the pump interface members include three channels, each channel extending from the first end to the second end of each corresponding pump interface member, each of the channels being separated by a slot extending from the first end to the second end of each corresponding pump interface member, the three channels arranged concentric with the respective centerline of the two cylindrical openings, wherein a plurality of coupling members for fastening peripheral components are at least partially disposed in the slots, wherein the first pump interface member and the second pump interface member are coupled to an adapter housing having an interior volume, and wherein the adapter housing is coupled to a vacuum pump positioned below the adapter housing;
a symmetric valve body positioned between the respective pump interface members and the interior volume of the adapter housing, the symmetric valve body comprising a first valve and a second valve, each of the first valve and second valve being coupled to a dedicated actuator at least partially within the interior volume of the adapter housing.

2. The apparatus of claim 1, wherein each of the three channels have a volume that is substantially equal.

3. The apparatus of claim 1, wherein each of the three channels of the first pump interface member is in selective communication with the vacuum pump.

4. The apparatus of claim 3, wherein each of the three channels of the second pump interface member is in selective communication with the vacuum pump.

5. The apparatus of claim 1, wherein the interior volume is shared between the three channels of the first pump interface member and the three channels of the second pump interface member.

6. The apparatus of claim 1, wherein each of the first and second pump interface members are disposed below and separate from the twin chamber housing.

7. An apparatus for processing a substrate, comprising:
a twin chamber housing having a body with a fluid channel formed therein, two transfer openings formed in a sidewall of the body, and a hinge feature on opposing sides of the body;
a modular pumping interface comprising:
a first pump interface member and a second pump interface member, wherein each of the pump interface members include a first end and a second end opposing the first end, wherein each of the pump interface members include three channels extending from the first end to the second end of each corresponding pump interface member, wherein each of the channels are separated by a slot extending from the first end to the second end of each corresponding interface member, and one or more coupling members for fastening peripheral components are at least partially disposed in each slot;
at least two separated volumes coupled to the twin chamber housing and providing two separate processing volumes within the twin chamber housing; and an independently operated valve for each processing volume and a dedicated actuator for each valve disposed in an interior volume of a symmetric valve body and an adapter housing coupled between each of the processing volumes and a single vacuum pump, wherein the single vacuum pump is positioned below the adapter housing.

8. The apparatus of claim 7, wherein the first pump interface member is coaxially aligned with one of two cylindrical openings formed in the twin chamber housing; and the second pump interface member is coaxially aligned with another of the two cylindrical openings formed in the twin chamber housing.

9. The apparatus of claim 8, wherein the three channels are concentric with a centerline of the two cylindrical openings.

10. The apparatus of claim 9, wherein each of the three channels of the first pump interface member include a volume that is substantially the same.

11. The apparatus of claim 9, wherein each of the three channels of the second pump interface member include a volume that is substantially the same.

12. The apparatus of claim 9, wherein the three channels of the first pump interface member and the three channels of the second pump interface member include a volume that is substantially the same.

13. The apparatus of claim 7, wherein the modular pumping interface is disposed below and separate from the twin chamber housing.

14. A twin volume substrate processing chamber, comprising:
a chamber body comprising two transfer openings, a plurality of ports, and a hinge feature, the body having a first cylindrical opening and a second cylindrical opening formed therethrough, and a fluid channel formed in a portion of the body surrounding the first and second cylindrical openings;
a first pump interface member coaxially aligned with a centerline of the first cylindrical opening, the first pump interface member having a plurality of first channels formed therein parallel to the centerline;
a second pump interface member coaxially aligned with a centerline of the second cylindrical opening and fluidly separated from the first pump interface member, wherein each of the pump interface members include a first end and second end opposing the first end, the second pump interface member having a plurality of second channels formed therein parallel to the centerline, wherein each of the first channels and each of the second channels of each of the first and second interface members extend from the first end to the second end of each corresponding pump interface member, wherein each of the first channels and each of the second channels are separated by a slot extending from the first end to the second end of each corresponding pump interface member, wherein the slot is parallel to the centerlines of the respective cylindrical openings, and one or more coupling members for fastening peripheral components are at least partially disposed in each slot, wherein the first pump interface member and the second pump interface member are coupled to an adapter housing having an interior volume; and wherein the adapter housing is coupled to a vacuum pump positioned below the adapter housing; and
a symmetric valve body comprising two valves, each having a valve actuator at least partially disposed in the interior volume of the adapter housing, the symmetric valve body positioned between the respective pump interface members and the interior volume of the adapter housing.

15. The twin volume substrate processing chamber of claim 14, wherein the interior volume is shared between the plurality of channels of the first pump interface member and the plurality of channels of the second pump interface member.

16. The twin volume substrate processing chamber of claim 14, wherein each of the first and second pump interface members are disposed below and separate from the twin chamber housing.

* * * * *